United States Patent
Kim et al.

(10) Patent No.: US 8,913,213 B2
(45) Date of Patent: Dec. 16, 2014

(54) LIGHT EMITTING APPARATUS AND DISPLAY APPARATUS USING THE SAME

(75) Inventors: Kyung Jun Kim, Gwangju (KR); Chul Ho Park, Ansan-si (KR)

(73) Assignee: LG Innotek Co., Ltd., Seoul (KR)

( * ) Notice: Subject to any disclaimer, the term of this patent is extended or adjusted under 35 U.S.C. 154(b) by 466 days.

(21) Appl. No.: 12/623,300

(22) Filed: Nov. 20, 2009

(65) Prior Publication Data

US 2010/0128199 A1 May 27, 2010

(30) Foreign Application Priority Data

Nov. 21, 2008 (KR) .................. 10-2008-0116523

(51) Int. Cl.
- G02F 1/1335 (2006.01)
- G09F 13/08 (2006.01)
- H01L 25/075 (2006.01)

(52) U.S. Cl.
CPC ...... *H01L 25/0753* (2013.01); *G02F 1/133603* (2013.01); *G02F 1/133609* (2013.01); *H01L 2224/48091* (2013.01); *H01L 2224/48247* (2013.01)
USPC ........................................ 349/69; 362/97.3

(58) Field of Classification Search
USPC .................... 349/69; 362/97.3, 612
See application file for complete search history.

(56) References Cited

U.S. PATENT DOCUMENTS

| | | | |
|---|---|---|---|
| 6,508,564 B1 | 1/2003 | Kuwabara et al. | |
| 6,513,949 B1 * | 2/2003 | Marshall et al. | 362/231 |
| 6,692,136 B2 | 2/2004 | Marshall et al. | |
| 6,900,471 B1 | 5/2005 | Wicke et al. | |
| 7,206,507 B2 | 4/2007 | Lee et al. | |
| 7,518,150 B2 | 4/2009 | Aihara | |
| 7,956,366 B2 | 6/2011 | Hiroyama et al. | |
| 2005/0135094 A1 * | 6/2005 | Lee et al. | 362/231 |
| 2005/0259195 A1 * | 11/2005 | Koganezawa | 349/65 |
| 2006/0198137 A1 * | 9/2006 | Lee et al. | 362/231 |
| 2007/0278934 A1 | 12/2007 | Van De Ven et al. | |
| 2008/0151527 A1 * | 6/2008 | Ueno et al. | 362/84 |
| 2010/0244731 A1 | 9/2010 | Kaihotsu et al. | |

FOREIGN PATENT DOCUMENTS

| | | |
|---|---|---|
| CN | 1355936 A | 6/2002 |
| CN | 1629536 A | 6/2005 |
| DE | 10216395 A1 | 10/2003 |
| EP | 1403936 A2 | 3/2004 |
| JP | 2001-184918 A | 7/2001 |
| JP | 2001-222242 A | 8/2001 |
| JP | 2002-170999 A | 6/2002 |
| JP | 2003-110150 A | 4/2003 |
| JP | 2003-515956 A | 5/2003 |
| JP | 2004-253745 A | 9/2004 |

(Continued)

*Primary Examiner* — Jessica M Merlin
(74) *Attorney, Agent, or Firm* — Birch, Stewart, Kolasch & Birch, LLP

(57) ABSTRACT

A light emitting apparatus including a first light emitting device including a first light emitting diode chip configured to emit light of a first rank included in a first color gamut, and a second light emitting device including a second light emitting diode chip configured to emit light of a second rank included in the first color gamut, in which the first rank is different than the second rank. In addition, the first and second light emitting devices are arranged in relation to each other such that the light emitted by the first emitting device mixes with light emitted by the second light emitting device to form light of a third rank different than the first and second ranks.

17 Claims, 9 Drawing Sheets

(56) References Cited

FOREIGN PATENT DOCUMENTS

| | | |
|---|---|---|
| JP | 2005-5482 A | 1/2005 |
| JP | 2006-128456 A | 5/2006 |
| JP | 2006-245443 A | 9/2006 |
| JP | 2007-227681 A | 9/2007 |
| JP | 2007-266583 A | 10/2007 |
| JP | 2007-288139 A | 11/2007 |
| JP | 2007-329502 A | 12/2007 |
| JP | 2008-34188 A | 2/2008 |
| JP | 2008-235680 A | 10/2008 |
| WO | WO 01/41215 A1 | 6/2001 |
| WO | WO 2009/101718 A1 | 8/2009 |

* cited by examiner

LIGHT EMITTING APPARATUS AND DISPLAY APPARATUS USING THE SAME

CROSS-REFERENCE TO A RELATED APPLICATION

The present application claims priority under to Korean Patent Application No. 10-2008-116523 filed on Nov. 21, 2008, which is hereby incorporated by reference in its entirety.

BACKGROUND OF THE INVENTION

1. Field of the Invention

The present disclosure relates to a light emitting apparatus and a display apparatus using the same.

2. Discussion of the Background

Light emitting diodes (LEDs) are becoming popular in many fields. For example, small electronic devices such as calculators, digital wrist watches, etc. use LEDs. LEDs that emit a white color are also being used in some applications such as in displays, indicators and illumination.

SUMMARY OF THE INVENTION

One object of the present invention is to provide a light emitting apparatus including a multi-rank light emitting device emitting a target color and a display apparatus including the light emitting apparatus.

Another object of the present invention is to provide a light emitting apparatus and corresponding display including a plurality of light emitting devices in which at least one light emitting device has a rank that is different from a target rank or target chromaticity.

Yet another object of the present invention is to provide a light emitting apparatus and corresponding display that achieves a target rank by mixing light from different ranked devices.

To achieve these and other advantages and in accordance with the purpose of the present invention, as embodied and broadly described herein, the present invention provides in one aspect a light emitting apparatus including a first light emitting device including a first light emitting diode chip configured to emit light of a first rank included in a first color gamut, and a second light emitting device including a second light emitting diode chip configured to emit light of a second rank included in the first color gamut, in which the first rank is different than the second rank. In addition, the first and second light emitting devices are arranged in relation to each other such that the light emitted by the first emitting device mixes with light emitted by the second light emitting device to form light of a third rank different than the first and second ranks. The present invention also provides a display apparatus including the light emitting apparatus.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by illustration only, and thus are not limitative of the present invention, and wherein.

DETAILED DESCRIPTION OF THE EMBODIMENTS

Reference will now be made in detail to the embodiments of the present disclosure, examples of which are illustrated in the accompanying drawings.

Figure 1:
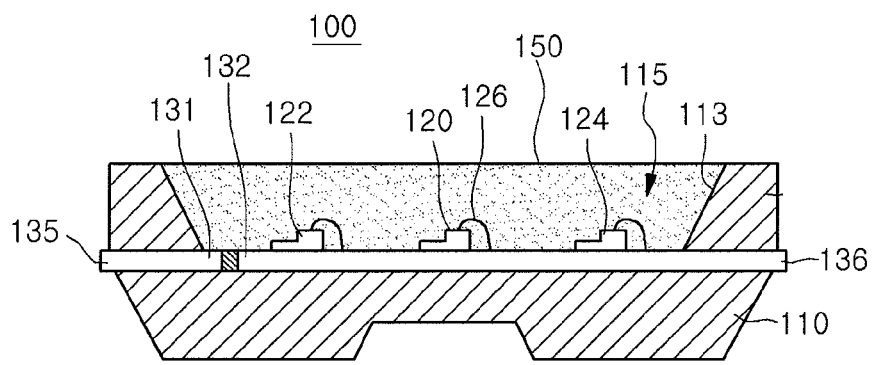
FIG. 1 is a side sectional view illustrating a light emitting device according to a first embodiment of the present invention.
Figure 2:
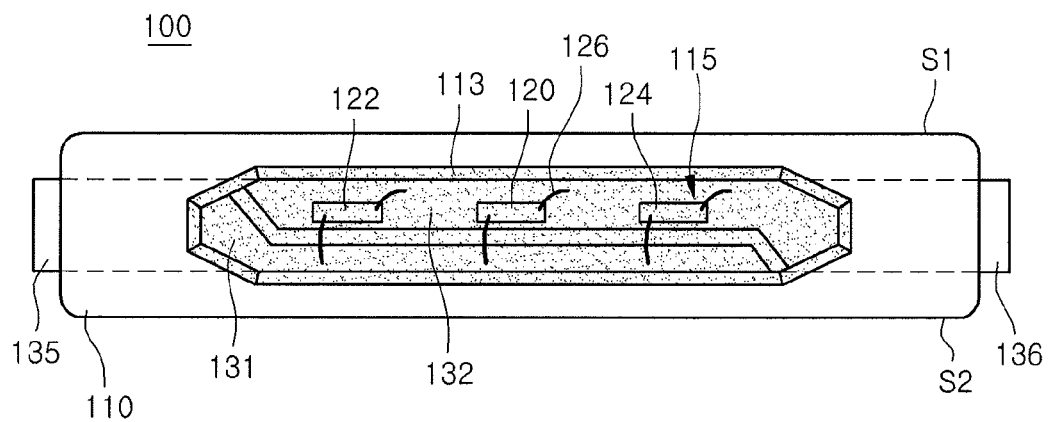
FIG. 2 is a plan view of the light emitting device of FIG. 1.

FIG. 1 is a side sectional view illustrating a light emitting device 100, and FIG. 2 is a plan view of the light emitting device 100 according to a first embodiment of the present invention. As shown in FIGS. 1 and 2, the light emitting device 100 includes a package body 110, a cavity 115, a plurality of lead electrodes 131 and 132 and a plurality of light emitting diode chips 120, 122 and 124.

The package body 110 may be formed of a silicon material, a ceramic material, a resin material, etc. For example, the package body 110 may be formed of silicon, silicon carbide (SiC), aluminum nitride (AlN), polyphthalamide (PPA), Liquid Crystal Polymer (LCP), etc. The package body 110 may also be formed in a mono- or multi-layer substrate structure or may be formed by an injection molding.

In addition, the cavity 115 having an opening is formed on the upper part of the package body 110, and may have a shape that is a hollow cup or a concave tube having a certain curvature. The shape of the surface of the cavity 115 may also be circular or polygonal, for example. The cavity 115 also can not be formed in some instances (e.g., where the LEDs are formed on the top surface of the package body).

In addition, as shown in FIG. 1, the side surfaces 113 of the cavity 115 are outwardly inclined to reflect an incident light to an opening direction. Further, the plurality of lead electrode 131 and 132 parallelly penetrating the package body 110 are disposed on the bottom of the cavity 115. The ends of the plurality of lead electrodes 131 and 132 are also used as external electrodes 135 and 136 of the package body 110.

The external electrodes 135 and 136 are also bent toward the front face S1 or the rear face S2 of the package body 110 when viewing a side view or a top view configuration. Further, the plurality of lead electrodes 131 and 132 may be formed in a lead frame type, a metal thin film type and a PCB (printed circuit board) type. Hereinafter, the lead frame type will be described as an example.

In addition, the plurality of light emitting diode chips 120, 122 and 124 are attached to one of the lead electrodes 131 and 132, and can be connected to the lead electrodes 131 and 132 using a wire 126. The light emitting diode chips 120, 122 and 124 may also be mounted selectively using wire bonding, die bonding or flip bonding, for example.

Further, the light emitting diode chips 120, 122 and 124 may be connected the plurality of lead electrodes 131 and 132 in series or in parallel. The pattern number of the lead electrodes 131 and 132 may also be varied with the above bonding method. Also, the light emitting diode chips 120, 122 and 124 may selectively include a semiconductor light emitting device manufactured using a compound semiconductor of group III-V elements, for example, AlInGaN, InGaN, GaN, GaAs, InGaP, AlInGaP, InP and InGaAs.

The light emitting diode chips 120, 122 and 124 may also be formed of a blue LED chip, a yellow LED chip, a green LED chip, a UV LED chip, an amber-colored LED chip and a blue-green LED chip. The number and the type of light emitting diode chips 120, 122 and 124 disposed in the cavity 115 may also be changed. Further, the plurality of light emitting diode chips 120, 122 and 124 may be a chip emitting different colors or a chip emitting the same color.

In addition, as shown in FIG. 1, a resin material 150 is formed in the cavity 115, and may be a transparent material such as silicon or epoxy. The surface of the resin material 150 may also be a flat, concave or convex. A lens can also be disposed on the resin material 150, and at least one type of fluorescent substance can be added to the resin material 150. Further, the lens disposed on the resin material 150 may have various shapes according to its function or light dispersion requirements.

The light emitting device 100 also emits a target light (e.g., white light) using the plurality of light emitting diode chips 120, 122 and 124. The light emitting device 100 may also be implemented using at least one type of a LED chip. However, the number of the LED chips is not limited. Further, a white light emitting device may be formed of complementary color (red/green/blue) LED chips, or may be formed of a blue-green LED chip and an amber color LED chip.

In addition, the rank of the light emitting device 100 is a region classifying the optical properties of the LED chips 120, 122 and 124 based on color coordinates, the main wavelength or the peak wavelength, or may be a region classifying the optical properties of the light emitting device 100 based on chromaticity and/or brightness.

Figure 3:
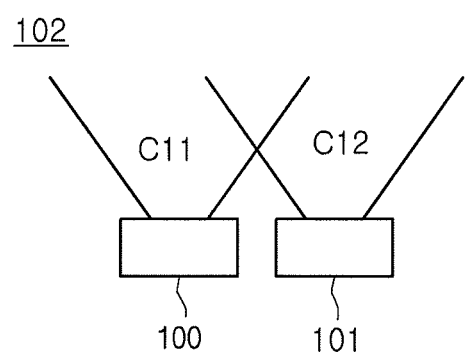
FIG. 3 is an overview illustrating a light emitting apparatus according to a second embodiment of the present invention.

Next, FIG. 3 is an overview illustrating a light emitting apparatus 102 according to a second embodiment of the present invention. FIGS. 1 and 2 will also be referred to throughout the rest of the description.

Referring to FIG. 3, the light emitting apparatus 102 includes light emitting devices 100 and 101. FIG. 2 illustrates two light emitting devices 100 and 101 but more may be used. The light emitting devices 100 and 101 are also disposed in a multi-rank and not a single rank. In more detail, the single rank means that the peak wavelength and the color coordinates of the same type of LED chips, for example, blue LED chips are included in the light emitting devices 100 and 101 (i.e., the chips have the same rank). That is, the same rank represents the same peak wavelength or the same color coordinates. Hereinafter, the explanation will be given based on the peak wavelength as being the rank of the chip.

LED chips manufactured from a wafer may not always have the same constant peak wavelength due to the manufacturing conditions and environments. For example, blue LED chips may be manufactured to have a peak wavelength from about 450 to about 455 nm. Thus, the wavelength is sorted into five ranks, for example, 450 nm, 451 nm, 452 nm, 453 nm, 454 nm and 455 nm by units of 1 nm. That is, the five LED chips are sorted in a multi-rank. Also, in the multi-rank, the main wavelengths may have a difference of about 1 nm or more, or may be different from each other. The main wavelength may also be defined as a wavelength appearing on the CIE color coordinates when an extension line is drawn from an achromatic color coordinates based on the color coordinates of an arbitrary light source.

Also, blue LED chips in a related-art light emitting apparatus (for example, a BLU set or an LED array module) use a single rank. That is, the LED chips used in one product have only one rank (for example, 453 nm) from five peak wavelengths (for example, about 450 nm to about 455 nm) for each light emitting device. In the single rank light emitting devices, a target chromaticity (i.e., target chromaticity rank) of the Commission International de l'Eclairage (CIE) Lxy is adjusted by sorting a blue LED chip, a green LED chip and a red LED chip. A related-art light emitting apparatus also has the limitation of reduced chip yield and package yield due to the use of a single rank.

In the embodiments of the present invention, the light emitting apparatus 102 mixes multi rank light emitting devices 100 and 101 to emit light with a target color coordinates distribution on the chromaticity diagram. That is, in the multi rank, a first LED chip of the first light emitting device 100 has a different chromaticity rank from a second LED chip of the second light emitting device 101. For example, when the first light emitting diode chip is a blue LED chip, the first blue LED chip (for example, a peak wavelength of about 454 nm) of the first light emitting device 100 and the second blue chip (for example, a peak wavelength of about 452 nm) of the second light emitting device 101 are in different ranks on the blue color region. One of the first blue LED chip and the second blue LED chip exists on a chromaticity rank that is outside of a target rank.

Further, the light emitting apparatus 102 can emit light with a target color coordinates distribution by mixing color of a first light distribution C11 of the first light emitting device 100 and a second light distribution C12 of the second light emitting device 101. Also, the light emitting devices 100 and 101 may include a multi rank LED chip. For example, at least one of RGB color LED chips may be a multi rank chip (for example, a blue LED chip), and not a single rank chip. A target color coordinates distribution (or target chromaticity rank) on the chromaticity diagram may be thus implemented by the multi rank light emitting devices 100 and 101.

In addition, even though the target chromaticity rank is a different rank than the light emitting device, at least one of the first and second light emitting devices 100 and 101 are mixed in color to emit light with a target color coordinates distribution or a specific achromatic color coordinates. Thus, the usage yield of the light emitting device is improved.

Figure 4:
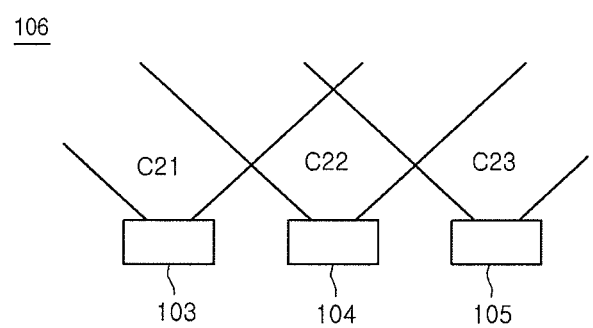
FIG. 4 is an overview illustrating a light emitting apparatus according to a third embodiment of the present invention.

Next, FIG. 4 is an overview illustrating a light emitting apparatus according to a third embodiment of the present invention. Referring to FIG. 4, a light emitting apparatus 106 includes light emitting devices 103, 104 and 105. The light emitting devices 103, 104 and 105 are also disposed on a target region in a multi chromaticity rank. Also, at least one color LED chip is disposed in a multi rank.

In addition, the light emitting devices 103, 104 and 105 may belong to a target chromaticity rank or an adjacent rank thereto. The light emitting devices 103, 104 and 105 are also arranged to emit a target light by mixing the light emitted by the different LEDs. Further, when the light emitting devices 103, 104 and 105 include blue LED chips, the blue LED chips are different ranks (for example, peak wavelengths of 454 nm, 454 nm and 455 nm, respectively). Red LED chips and/or green LED chips other than blue LED chips can also be disposed in different ranks. Other examples also apply.

The light distributions C21, C22 and C23 of the light emitting devices 103, 104 and 105 are mixed with each other to emit light with a target color coordinates distribution on the chromaticity diagram. Thus, by using at least one of the light emitting devices 103, 104 and 105 that deviate from a target chromaticity rank, the usage yield of an LED chip and a light emitting device are improved.

More specifically, a light emitting apparatus may mix multi rank light emitting devices to emit light with a target chromaticity distribution in the CIE Lxy region. For example, if five-rank blue LED chips, a single rank green LED chip and a single rank red LED chip are mixed, the light emitting devices may emit light with a target chromaticity rank.

Also, in the embodiments of the present invention, a target chromaticity rank is configured by mixing n (2≥n)-rank light emitting devices. That is, a target chromaticity rank can be made by mixing light emitting devices having a symmetrical relation based on a target chromaticity rank, and/or a complementary color relation with each other. This may be defined as a combination of multi-rank light emitting devices.

When n (2≥n)-rank light emitting devices are combined, a rank belonging to a target color coordinates distribution as well as ranks (or adjacent ranks) deviating from the target color coordinates distribution may be included. When a plurality of light emitting devices are combined, light emitting devices having ranks with symmetrical relation or complementary color relation may also be combined. Thus, a light emitting apparatus can emit light with a target color coordinates distribution by combining multi-rank light emitting devices.

Further, a light emitting apparatus can also include light emitting devices that do not affect a target chromaticity or a target rank of a target color coordinates distribution. Thus, the embodiments of the present invention improve the usage yield of an LED chip by including at least one LED chip in a plurality of light emitting devices with a multi-rank.

Figure 5:
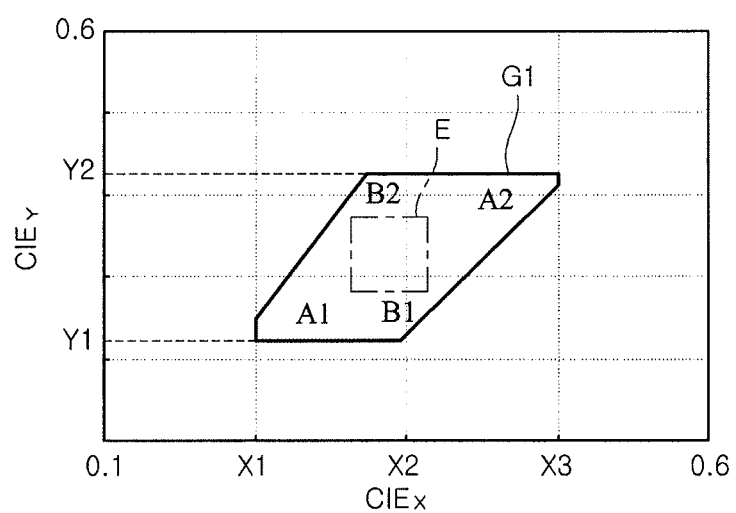
FIG. 5 is a graph illustrating the Commission International de I'Eclairage (CIE) color coordinates with respect to multi-rank light emitting devices according to an embodiment of the present invention.

Next, FIG. 5 is a graph illustrating the CIE color coordinates with respect to multi-rank light emitting devices according to an embodiment of the present invention. Referring to FIG. 5, optical properties (brightness and chromaticity) of light emitting devices are widely distributed in a region G1 on CIE X and CIE Y coordinates. Further, the multi-rank light emitting devices are widely distributed on the color coordinates.

An extensive color coordinative distribution is also implemented by disposing at least one type of LED chip (for example, a blue LED chip) with a multi-rank. In addition, the distribution region G1 is obtained by measuring three color light emitting devices. For example, X1, X2, and X3 are about 0.42, 0.44, and 0.46, respectively, and Y1 and Y2 are about 0.385 and 0.425, respectively. Other values may also be used.

Further, a criterion for sorting the multi-rank may be a color coordinates difference. In more detail, the color coordinates difference sorts multi-ranks by subdividing the range of the brightness and the chromaticity on a distribution region G1 obtained by measuring the optical distribution property of an individual light emitting device. Among the distribution region G1, a region that can be reproduced into a similar color becomes a target rank E. Further, the target rank may be defined as a target chromaticity rank or a target color coordinates distribution.

In addition, each of ranks A1, A2, B1, B2 and E of the distribution region G1 may be classified into regions similarly perceived by the human visual sense. Also, while a related-art single rank is only used for target rank light emitting devices, the multi-rank is a combination of light emitting devices of different ranks among the ranks A1, A2, B1, B2 and E of the entire region G1. Thus, the usage yield of a package is much more improved than when a related-art single rank is used.

The multi-rank may also be configured by selectively combining light emitting devices included in the target rank E and ranks A1, A2, B1 and B2 adjacent thereto. For example, A2/A1 rank light emitting devices and B1/B2 rank light emitting devices having a complementary color relation may be combined. Also, A1/B1/B2, A1/A2/B1, A1/A2/B2 and B1/B2/A2 rank light emitting devices passing the target rank may be combined. A target chromaticity may also be set using the above combination, and a target rank device may be included in the multi-rank.

In addition, the criteria for combining into multi-rank includes setting one rank set based on the chrominance $\Delta E$ ($0<\Delta E \leq 5$) by a CIE Lab (color space considering human visual perception), in consideration of both the chromaticity and/or brightness. Among the set ranks, ranks located at different color spaces are combined.

Figure 6:
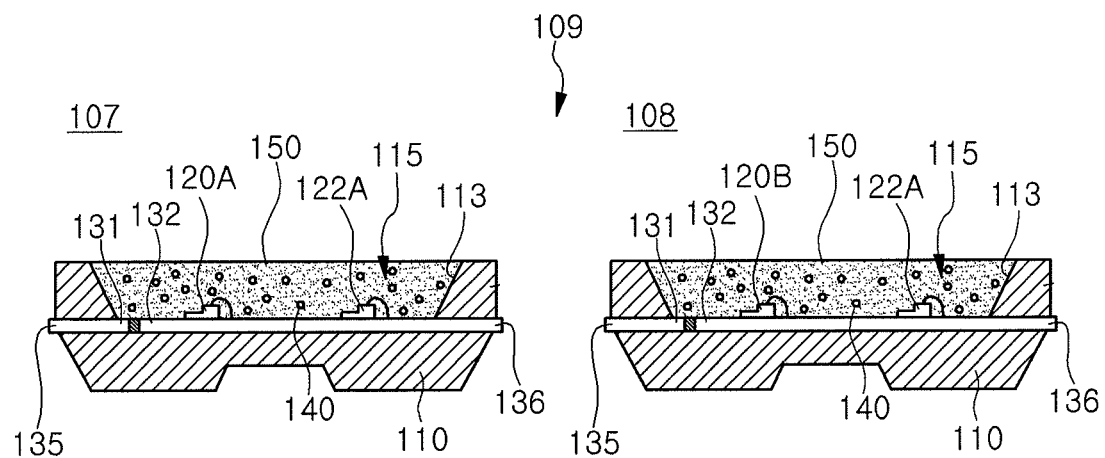
FIG. 6 is an overview illustrating a light emitting apparatus according to a fourth embodiment of the present invention.

Next, FIG. 6 is an overview illustrating a light emitting apparatus 109 according to a fourth embodiment of the present invention. A description of parts identical to those of the above embodiments will not be repeated. Referring to FIG. 6, the light emitting apparatus 109 includes first and second light emitting devices 107 and 108 of multi-rank.

As shown, the first light emitting device 107 includes LED chips 120A and 122A, and the resin material 150 having a fluorescent substance in the cavity 115 of the package body 110. Further, the second light emitting device 108 includes LED chips 120B and 122A, and the resin material 150 having a fluorescent substance in the cavity 115 of the package body 110.

The first light emitting device 107 and the second light emitting device 108 can also be implemented as a white light emitting device. The light emitting apparatus 109 uses the first LED chip 120A of the first light emitting device 107 and the second LED chip 120B of the second light emitting device 108 with a multi rank. The first and second LED chips 120A and 122A of the first light emitting device 107 can also be a chip emitting the same color light, for example, a blue LED chip with a multi-rank. The first and second LED chips 120B and 122A of the first light emitting device 108 can also be a chip emitting the same color light, for example, a blue LED chip with a multi-rank.

The resin material 150 molded in the cavity 115 of the package body 110 can also include at least one kind of fluorescent substance. In one embodiment, a yellow color fluorescent substance may be added in response to the blue LED chip. Thus, the light emitting apparatus 109 can emit light with a target chromaticity by combining the multi-rank LED chips 120A and 120B, a single rank LED chip 122A, and a fluorescent substance 151 as the multi-rank light emitting devices 108 and 109. Although two light emitting devices are described as an example in this embodiment, three or more light emitting devices may be included in a multi link group according to the arrangement location and the mixed color region.

Figure 7:
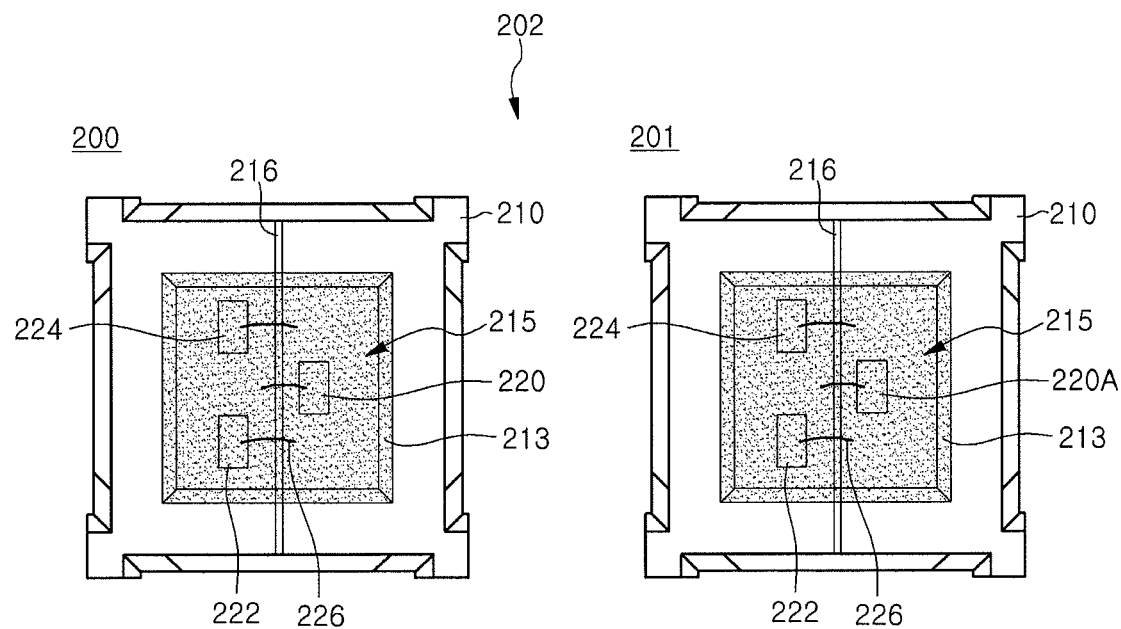
FIG. 7 is an overview illustrating a light emitting apparatus according to a fifth embodiment of the present invention.

Next, FIG. 7 is an overview illustrating a light emitting apparatus according to a fifth embodiment of the present invention. Descriptions of previous components will not be repeated. Referring to FIG. 7, a light emitting apparatus 202 includes first and second light emitting devices 200 and 201 with a multi-rank. Further, the first and second light emitting devices 200 and 201 are implemented in the package body 210 formed of silicon, for example.

Further, in the first light emitting device 200, light emitting diode chips 220, 222 and 224 are electrically connected to lead electrodes 213 and 215 of the cavity 215 through a wire and/or die bonding method. In the second light emitting device 201, light emitting diode chips 220A, 222 and 224 are electrically connected to lead electrodes 213 and 215 of the cavity 215 through a wire and/or die bonding method. The chips may also be mounted through a wire, die or flip method.

In addition, the light emitting devices 200 and 201 emit a white light using a combination of the plurality of light emitting chips 220, 220A, 222 and 224. That is, the light emitting apparatus 202 can achieve a target chromaticity rank using the multi-rank light emitting devices 200 and 201. Also, although two light emitting devices are described as an example in this embodiment, three or more light emitting devices may be included in a multi link group according to the arrangement location and the mixed color region.

Figure 8:
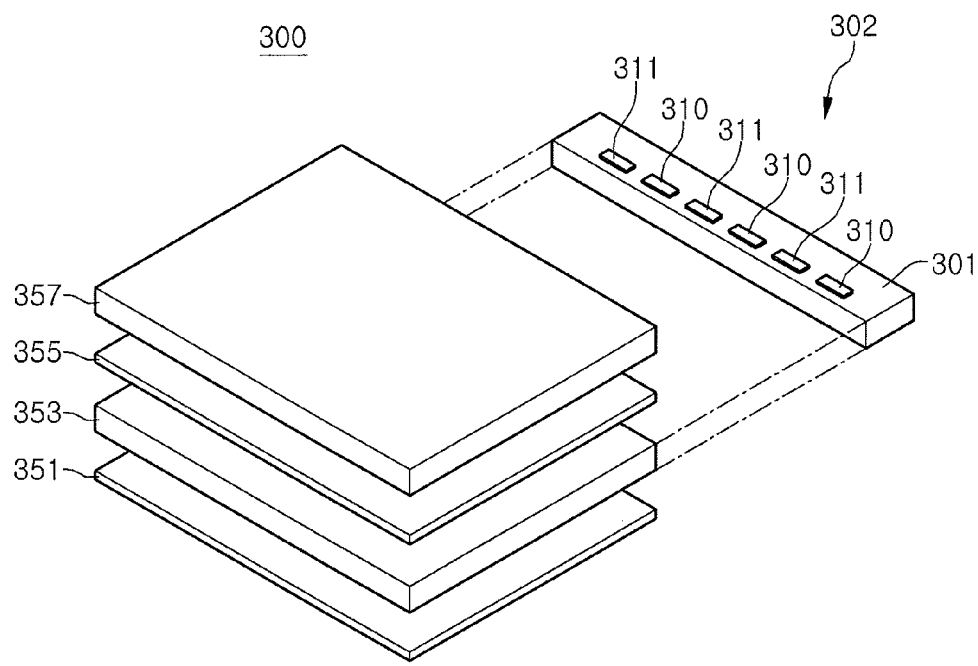
FIG. 8 is an overview illustrating a display apparatus according to a sixth embodiment of the present invention.

Next, FIG. 8 is an overview illustrating a display apparatus 300 according to a sixth embodiment of the present invention. Referring to FIG. 8, the display apparatus 300 includes a light emitting module 302, a reflection plate 351, an optical guide plate 353, an optical sheet 355 and a display panel 357. The light emitting module 302 also includes a board 301 and multi-rank light emitting devices 310 and 311.

Further, as shown, the multi-rank first and second light emitting devices 310 and 311 are alternately disposed on the light emitting module 302. The board 301 may also be a rigid or flexible board. Also, in the light emitting module 302, the first and second light emitting devices 310 and 311 may include a plurality of LED chips, for example, a red LED chip, a green LED chip and a blue LED chip.

In one example, the red LED chip uses chips having the same wavelength (for example, about 610 nm), the green LED chip uses chips having the same wavelength (for example, about 530 nm), and the blue LED chip uses chips having different peak wavelengths. Thus, a multi-rank may be configured by using an LED chip of a wavelength of about 454 nm in the first light emitting device 310 and an LED chip of a wavelength of about 455 nm in the second light emitting device 311.

In addition, the blue LED chip can produce a wavelength from about 440 nm to about 460 nm of a blue light by units of about 1 nm or about 2 nm for a multi-rank. The green LED chip can produce a wavelength from about 525 nm to about 535 nm of a green light by units of about 1 nm or about 2 nm for a multi-rank, and the red LED chip can produce a wavelength from about 615 nm to about 630 nm of a red light by units of about 1 nm or about 2 nm for a multi-rank. Thus, a multi-rank may be configured by selectively applying these ranks to the first and second light emitting devices 310 and 311.

Further, the light emitting module 302 may group two light emitting devices 310 and 311 into a multi-rank, or may group three or more light emitting devices into a multi-rank, thereby arranging them in a predetermined interval. For example, the first light device 310 and the second light device 311 may be alternately arranged, or one of the first and second devices 310 and 311 may be successively arranged. Colors emitted from the multi-rank first and second light emitting devices 310 and 311 are also combined to make a target chromaticity rank.

In addition, the optical guide plate 353 is disposed on one side of the light emitting apparatus 302, and the reflection plate 351 is disposed under the optical guide plate 353. The optical sheet 355 is also disposed over the optical guide plate 353. Further, the optical guide plate 353 may be formed of a PC or poly methyl methacrylate (PMMA) material. Other suitable materials may also be used.

Thus, light emitted from the light emitting apparatus 302 enters the optical guide plate 353, which guides the incident light from the light emitting apparatus 302 to the total region to emit light as a surface light source. The reflection plate 351 reflects light leaked from the optical guide plate 353, and the optical sheet 355 diffuses/concentrates the incident light from the optical guide plate 353, and irradiates the light to the display panel 357.

Also, the optical sheet 355 may include at least one of a diffuser sheet, a horizontal and vertical prism sheet and a brightness enhancement film. In addition, the diffuser sheet also diffuses an incident light, the horizontal and vertical prism sheet concentrates an incident light on a display region, and the brightness enhancement film equalizes brightness distribution.

Further, the display panel 357 (which can be an LCD panel, for example) includes first and second substrates opposite to each other, and a liquid crystal layer intervened between the first and second substrates. The first substrate may also be implemented in a color filter array substrate, and the second substrate may be implemented in a TFT array substrate, or vice versa. In addition, the structure of the display panel 357 may be modified. Also, a polarizing plate can be attached to a surface of the display panel 357.

Figure 9:
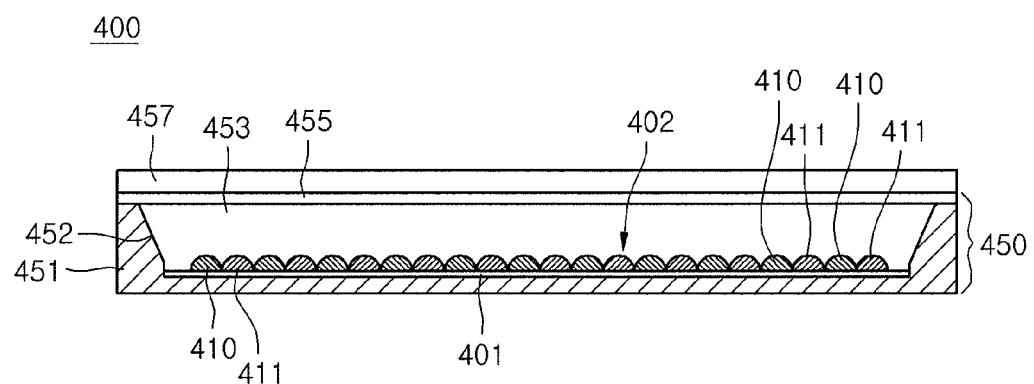
FIG. 9 is an overview illustrating a display apparatus according to a seventh embodiment of the present invention.

Next, FIG. 9 is an overview illustrating a display apparatus 400 according to a seventh embodiment of the present invention. Referring to FIG. 9, the display apparatus 400 includes a light emitting module 402, a bottom cover 451, an optical sheet 455 and a display panel 457. The light emitting module 402, the bottom cover 451 and the optical sheet 455 also serve as a light unit 450.

Further, the bottom cover 451 includes a module receiver 453 opened upwardly with the side surfaces of the module receiver 453 being inclined. In addition, the light emitting module 402 is implemented in a module pattern, and at least one light emitting module 402 is disposed on the bottom surface of the module receiver 453 in the bottom cover 451. Multi-rank light emitting devices 410 and 411 are also alternately disposed in the light emitting module 402 on a board 401.

In addition, the light emitting module 402 may include three or more light emitting devices in different rank, which may be disposed alternately or in a group. A target chromaticity can also be made by disposing the light emitting devices at a predetermined period. Further, the multi-rank light emitting devices may be added or modified, and the number of the light emitting devices is not limited. A plurality of light emitting devices 410 and 411 may also be alternately disposed, may be located opposite to each other, or may be disposed in a zigzag patter.

In addition, the optical sheet 455 may include at least one of a diffuser sheet, a horizontal and vertical prism sheet and a brightness enhancement film. The diffuser sheet diffuses an incident light, the horizontal and vertical prism sheet concentrates an incident light on a display region, and the brightness enhancement film equalizes brightness distribution.

Further, the display panel 457 such as an LCD panel includes first and second substrates opposite to each other, and a liquid crystal layer intervened between the first and second substrates. The first substrate may be implemented in a color filter array substrate, and the second substrate may be implemented in a TFT array substrate, or vice versa. The structure of the display panel 357 may also be modified. A polarizing plate may also be attached to a surface of the display panel 357.

Also, in this embodiment, the rank chrominance in CIB Lab space is set according to chromaticity and brightness, i.e., optical properties of an LED package, and each rank is sorted based on the chromaticity in the CIB Lab space. The sorted rank sets a target chromaticity by combining LED packages of color senses in a complementary and/or symmetrical relation to each other based on a rank in a reference color (for example, white) region.

Figure 10:
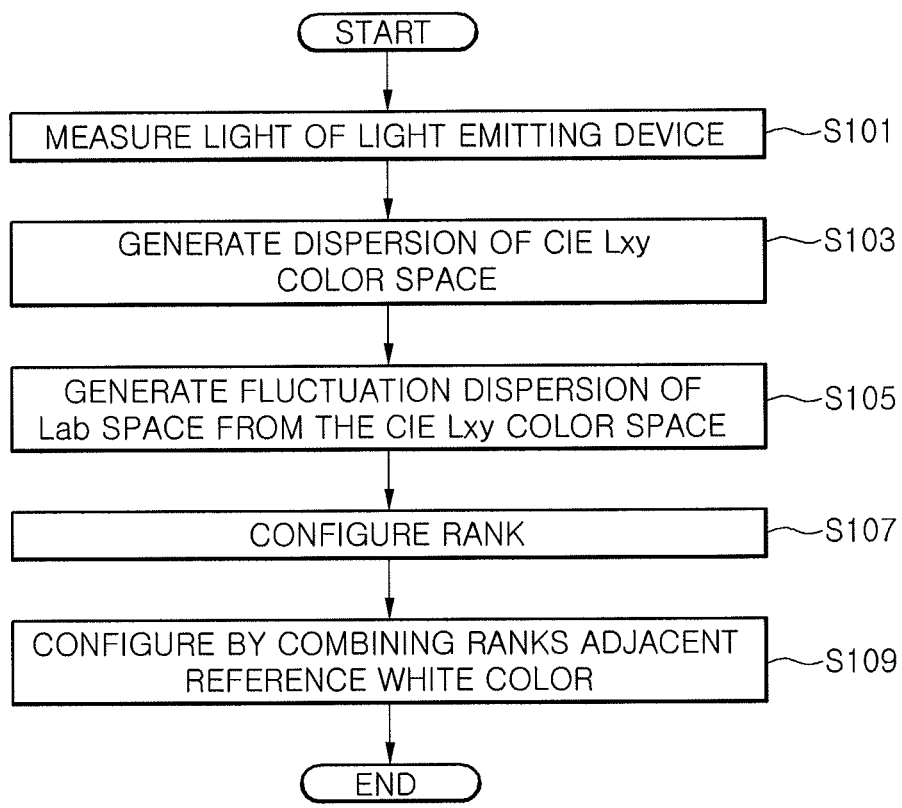
FIG. 10 is a flowchart illustrating a method of manufacturing a light emitting apparatus according to an eighth embodiment of the present invention.

Next, FIG. 10 is a flowchart illustrating a method of manufacturing a light emitting apparatus according to an eighth embodiment of the present invention. Referring to FIG. 10, the dispersion of CIE Lxy color space is generated by measuring optical properties, for example, the brightness and chromaticity of a light emitting device (S101 and S102).

Figure 11:
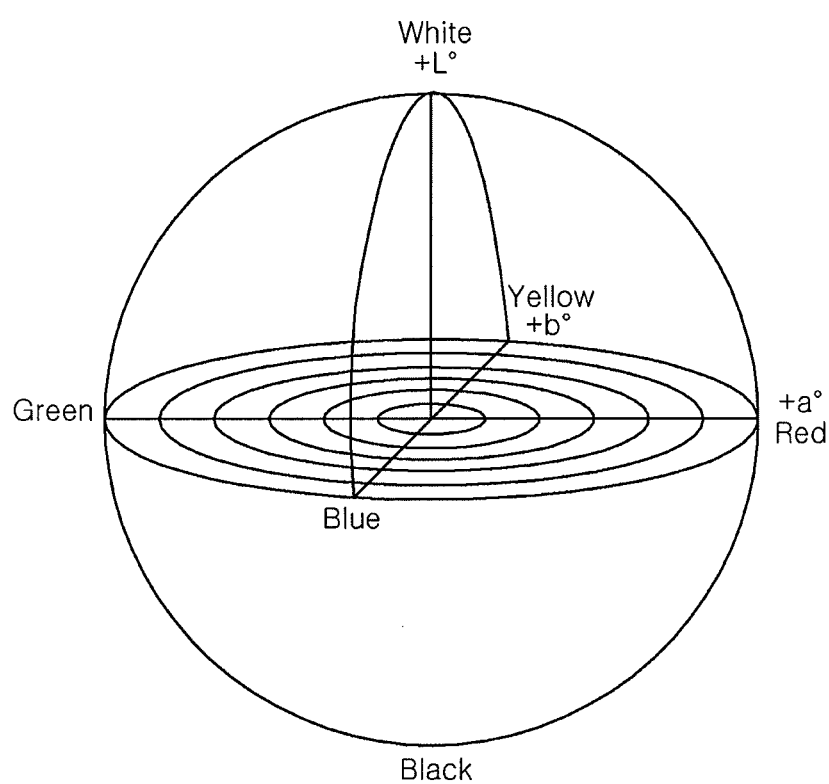
FIG. 11 is a diagram illustrating a CIE Lab color space of a light emitting apparatus according to the eighth embodiment of the present invention.

Further, the CIE Lxy color space is a chromaticity diagram obtained by plotting the three primary colors, red, green and blue in a three-dimensional space of X, Y and Z as shown in FIG. 11. For example, the CIE Lxy color space represents light dispersion of each multi-rank light emitting device. In this instance, L is an axis representing brightness, and xy represents chromaticity as two-dimensional plane coordinates of x and y.

Then, a fluctuation dispersion of Lab space is generated from the CIE Lxy color space (S105). That is, the dispersion characteristics of the CIE Lxy color space are converted into the fluctuation dispersion of the CIE Lab considering human optical perception. A rank is then configured based on the Lab in consideration of both brightness and chromaticity in the CIE Lab color space (S107). In this instance, the chrominance range of Δ E is set for each rank. Further, Δ E, which is a chrominance of the Lab space, can be calculated from the three-dimensional space distance value. When the rank of the light emitting devices is configured, a light emitting apparatus can be configured by combining multi-rank light emitting devices among the configured ranks (S109).

Thus, referring to FIG. 11, L is obtained by converting luminance value into lightness that a person feels in the CIE Lab color space of the light emitting device. In FIG. 11, +a of ab is a degree of redness, −a of ab is a degree of greenness, b is a degree of yellowness, and −b is a degree of blueness.

Figure 12:
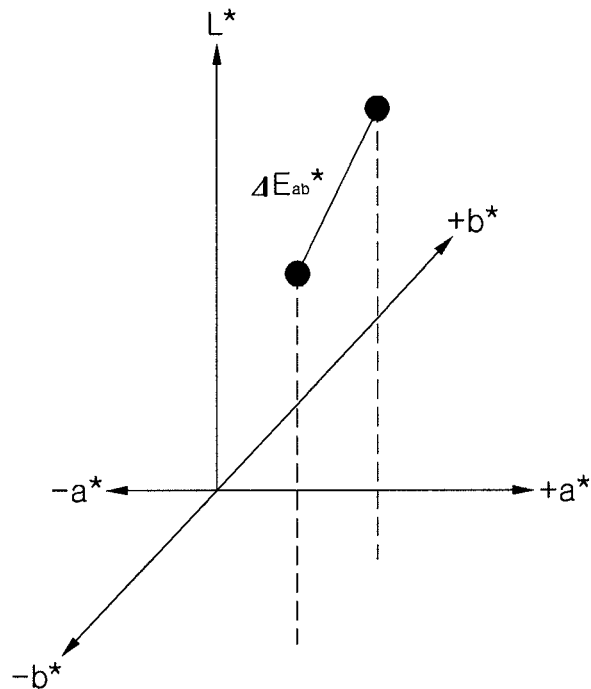
FIG. 12 is a graph representing a CIE Lab color space on a plane according to the eighth embodiment of the present invention.

Further, FIG. 12 is a graph representing a CIE Lab color space on a plane. As shown, L* represents lightness on a vertical axis, and −a* and +a* represent chromaticity, which are included in a horizontal planar space. Also, the greater the positive value +a* is, the greater the degree of redness is. On the contrary, the greater negative value −a* is, the greater the degree of blueness is, and the greater positive value +b* is, the greater the degree of yellowness is. On the contrary, the greater negative value −b* is, the greater the degree of blueness is. In addition, the center of the CIE Lab color space is an achromatic color, and Δ Eab* represents a distance between two points in the three-dimensional space of Lab space, i.e., chrominance.

In addition, the formula calculating L, a* and b* can be expressed as the following Equation 1:

$$L^* = 116\left(\frac{Y}{Y_n}\right)^{1/3} - 16$$

$$a^* = 500\left[\left(\frac{X}{X_n}\right)^{1/3} - \left(\frac{Y}{Y_n}\right)^{1/3}\right]$$

$$b^* = 200\left[\left(\frac{Y}{Y_n}\right)^{1/3} - \left(\frac{Z}{Z_n}\right)^{1/3}\right]$$

Equation 1 where L* is a lightness, a* is a value of redness-greenness, and b* is a value of yellowness-blueness. Yn, Xn and Zn represent tristimulus values of white color, and X, Y and Z are color coordinates.

Also, a chrominance value can be obtained from $\Delta E = \sqrt{(\Delta L^*)^2 + (\Delta a^*)^2 + (\Delta b^*)^2}$. In addition, the chromaticity value Δ E represents a distance between two points for each rank, and the chrominance value Δ E for each rank may range 0<Δ E≤5. Also, a person's perception range of Δ E may have 2 to 3 chrominance in a case of a single color image, and a maximum perceivable range may have 5 to 6 chrominance for a complex image. That is, if the chrominance is less, the image may seem more uniform through human visual perception.

Figure 13:
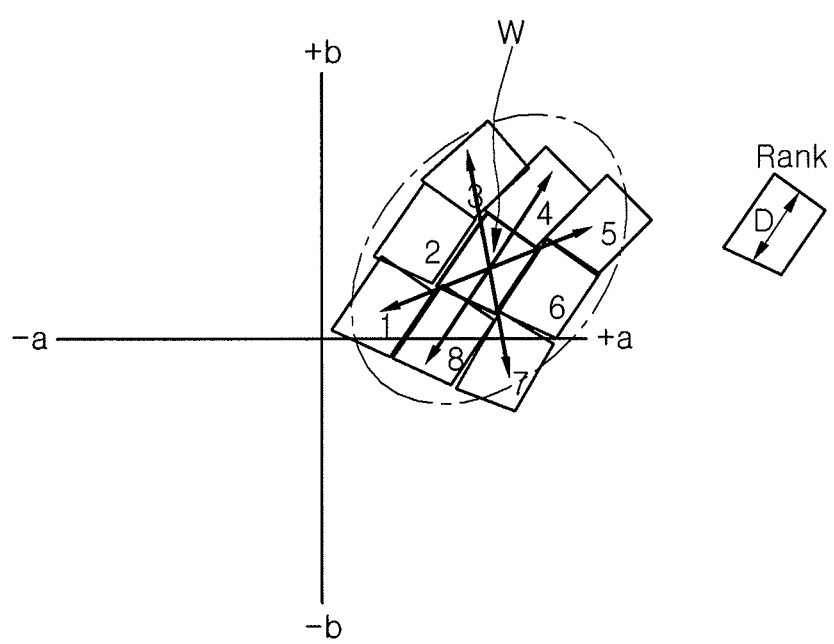
FIG. 13 is a graph illustrating a multi-rank in a CIE Lab space of a light emitting apparatus according to the eighth embodiment of the present invention.

Next, FIG. 13 is a graph illustrating a multi-rank in a CIE Lab space of a light emitting apparatus according to an embodiment of the present invention. Referring to FIG. 13, the fluctuation dispersion of the CIE Lab color space is subdivided into ranks by optical properties. The rank classification criterion may also be classified into various stages according to similar chromaticity and brightness to a target chromaticity. Further, the rank is classified according to the light emitting properties such as brightness and chromaticity of the light emitting device.

In addition, a target rank W of the sorted ranks is a rank of a reference color (for example, white color) that may be reproduced into a similar color. Adjacent ranks 1 to 8 are also shown disposed around the target rank W. Thus, the target rank W and the adjacent ranks 1 to 8 may be defined as an available rank for multi-rank.

Also, a range within the same distance D from the center of each region may be defined as one rank, and the number of available ranks may be varied with the distance D of each rank. For example, the chrominance of each rank W of 1 to 8 can be set to Δ E=±3 distance D, and the chrominance Δ E of each rank may range 0<Δ E≤5. Also, if the chrominance Δ E is decreased, the distance D of the available rank is increased, but the number of the available ranks is decreased. If the chrominance Δ E is increased, the distance D of the available rank is decreased, but the number of the available ranks is increased. Further, the number of the available ranks can be changed into 4, 8, 16, 32, etc.

In addition, when the rank of the light emitting devices is configured, a light emitting apparatus may be configured by combining multi-rank light emitting devices among the configured ranks. In selecting the multi-rank, light emitting devices belonging to ranks of symmetrical region around a target rank may be combined. As an example, ranks 3 and 7, ranks 1 and 5, and ranks 2 and 6 in the fluctuation dispersion of FIG. 13 may be combined, respectively. Light emitting devices belonging to adjacent ranks to the target rank may also be combined. As an example, ranks 3, 4 and 8, ranks 2, 4 and 8, ranks 2, 5 and 8, and ranks 1, 5 and 8 in the fluctuation dispersion of FIG. 13 may be combined, respectively. Light emitting devices belonging to the target rank may further be combined.

Thus, the light emitting apparatus according to the embodiments of the present invention can implement a target chromaticity by combining multi-rank light emitting device through the rank configuration as described above. According to one embodiment, the light emitting apparatus can be configured by combining lightness rank subdividing a lightness level, as well as combining available ranks with respect to color.

Figure 14:
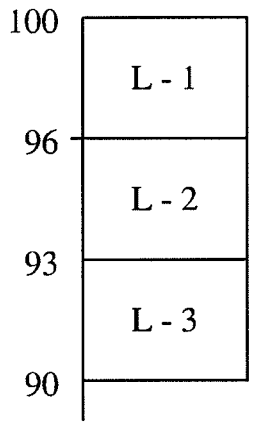
FIG. 14 is an overview illustrating a rank of a lightness level of a light emitting apparatus in a method of manufacturing a light emitting apparatus according to a ninth embodiment of the present invention.

Next, FIG. 14 is an overview illustrating a rank of a lightness level of a light emitting device in a method of manufacturing a light emitting apparatus according to a ninth embodiment of the present invention. Referring to FIG. 14, the configuration of rank according to the lightness of a light emitting device is divided into multi-stages. When the lightness level of the light emitting device ranges from 90 to 100, ten levels between 90 and 100 may be subdivided into certain stages (for example, three stages). For example, when the lightness level is divided into three stages (L-1, L-2 and L-3), the lightness level of the three stages may be combined with available ranks.

More specifically, there are 27 cases in combination of the lightness levels (L-1, L-2 and L-3) of three stages, and nine available ranks W and 1 to 8 described in FIG. 13. A light emitting apparatus can then emit a target chromaticity by selectively combining the multi-rank using the different cases. Also, the lightness level divided into the three levels may be applied to all available ranks. For example, a light emitting device of a lightness level L-1, and a light emitting device of two available ranks with respect to chromaticity may be combined to implement a target chromaticity. That is, a light emitting apparatus may be configured by combining light emitting device of an available rank with respect to the chromaticity and ranks with respect to lightness.

Figure 15:
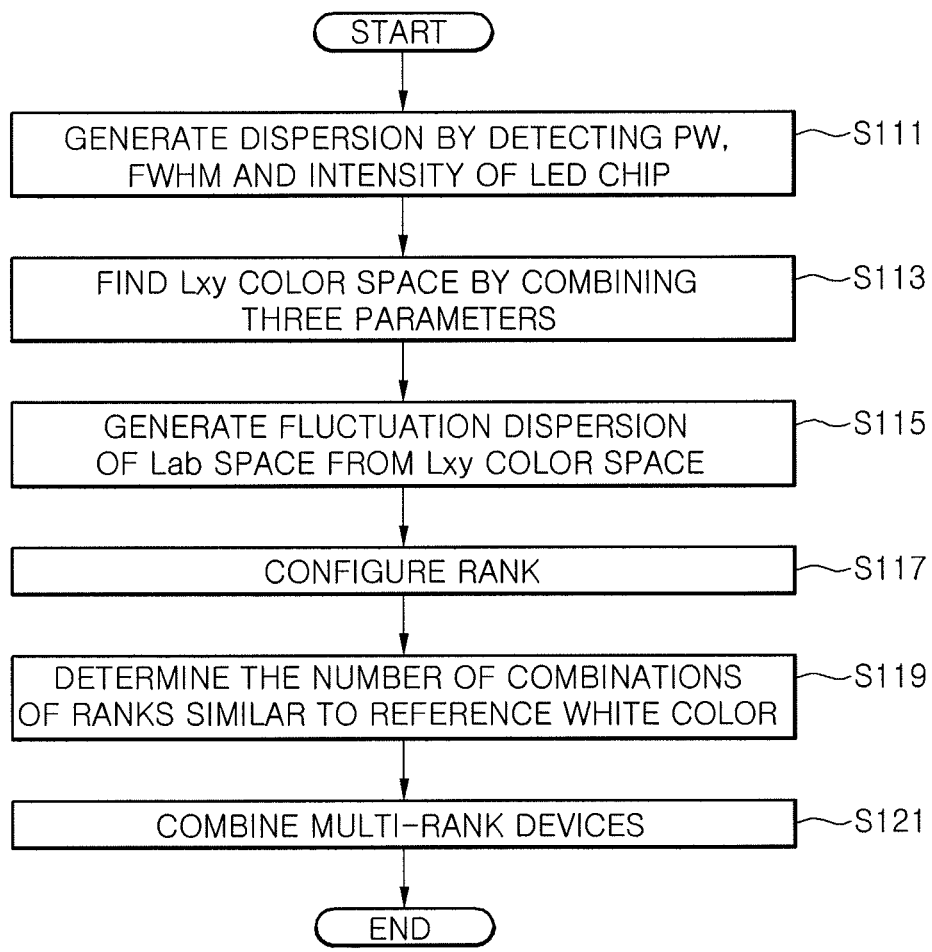
FIG. 15 is a flowchart illustrating a method of manufacturing a light emitting apparatus according to a tenth embodiment of the present invention.

Next, FIG. 15 is a flow chart illustrating a method of manufacturing a light emitting apparatus according to a tenth embodiment of the present invention. Referring to FIG. 15, the optical dispersion is generated by detecting optical property parameters of each LED chip, for example, peak wavelength PW, Full Width at Half-Maximum (FWHM), intensity (S111). Also, the LED chip may be a red LED chip, a green LED chip or a blue LED chip.

In addition, all available cases are made on each chip through a combination of three property parameters, i.e., PW, FWHM and intensity. That is, all the available cases are made by applying the Gaussian Function through a combination of three property parameters for each LED chip. Then, a fluctuation dispersion is generated by transforming from CIE Lxy space to CIE Lab space, simulated by a combination of the red LED chip, the green LED chip and the blue LED chip (S113 and S115).

Next, the ranks of each device are configured in the CIE Lab space (S117), and the number of cases of similar ranks to a reference color region (for example, white color) is determined (S119). Also, each rank sets a range through calculation of chrominance Δ E. That is, available ranks are set according to the range of the chrominance Δ E in the CIB Lab color space. Among the available ranks, the number of (two or more) cases of combinations of similar ranks to the reference color region (for example, white color) is determined. Then, a target chromaticity is implemented by combining light emitting devices of the combined ranks (S121).

Therefore, in a light emitting apparatus according to embodiments of the present invention, a plurality of light emitting devices are configured by at least one type of LED chips in a multi-rank. Also, when a plurality of one type of LED chips are disposed in a light emitting device of a light emitting apparatus, the plurality of one kind of LED chips may be configured in a multi-rank. A target chromaticity can be also implemented by the light emitting device of the multi-rank.

Further, a light emitting device according to an embodiment can be applied to light sources such as front light and/or back light of mobile terminals, portable computers, and broadcasting devices and an illumination devices such as street lamps, interior lighting devices, etc.

In addition, a first light emitting diode chip can have a same peak wavelength as a second light emitting diode chip but include an additional phosphor layer to change the peak wavelength. Thus, the rank of the first light emitting diode chip can be changed using the phosphor layer.

While this invention has been particularly shown and described with reference to preferred embodiments thereof, various changes in form and details may be made without departing from the spirit and scope of the invention as defined by the appended claims. Also, the preferred embodiments should be considered in descriptive sense only and not for purposes of limitation. Therefore, the scope of the invention is defined not by the detailed description of the invention but by the appended claims, and all differences within the scope will be construed as being included in the present invention.

Also, any reference in this specification to "one embodiment," "an embodiment," "example embodiment," etc., means that a particular feature, structure or characteristic described in connection with the embodiment is included in at least one embodiment of the invention. The appearances of such phrases in various places in the specification are not necessarily all referring to the same embodiment. Further, when a particular feature, structure or characteristic is described in connection with any embodiment, it is submitted that it is within the purview of one skilled in the art to effect such feature, structure, or characteristic in connection with other ones of the embodiments In the description of embodiments, the reference about 'on' and 'under' each element is made based on the drawings. Also, the thickness of each layer in the drawings is an example, and is not limited thereto. Technical features of one embodiment can be selectively applied to another embodiment without being limited to each embodiment.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A light emitting apparatus, comprising:
a first light emitting device including first and second light emitting diode chips configured to emit light of a first rank included in a blue color gamut; and
a second light emitting device including third and fourth light emitting diode chips configured to emit light of a second rank included in the blue color gamut, said first rank being different than the second rank, wherein the first and second light emitting devices are arranged in relation to each other such that the light emitted by the first light emitting device mixes with light emitted by the second light emitting device to form light of a third rank different than the first and second ranks, wherein the first rank and the second rank are distributed in the blue color gamut and have different peak wavelength from each other, wherein the first and second light emitting devices have a different peak wavelength classified in the blue color gamut, wherein the first and second light emitting diode chips have a difference peak wavelength from each other in the blue color gamut, wherein the third and fourth light emitting diode chips have a difference peak wavelength from each other in the blue color gamut, wherein the first light emitting device is a first body having a first cavity and a resin material having a fluorescent substance covering the first and second light emitting diode chips disposed in the first cavity, wherein the second light emitting device includes a second body having a second cavity and a resin material having a fluorescent substance covering the third and fourth light emitting diode chips in the second cavity, and wherein the first body is spaced apart from the second body.

2. The light emitting apparatus of claim 1, further comprising:

a third light emitting device including a fifth light emitting diode chip configured to also emit light of a fourth rank included in the blue color gamut, wherein the first, second and third light emitting devices are arranged in relation to each other such that the light emitted by the first, second and third light emitting devices mix to form the light of the third rank, and wherein the fourth rank is distributed in the blue color gamut, and wherein the first rank and the fourth rank have a different peak wavelength in the blue color gamut.

3. The light emitting apparatus of claim 1, wherein the first and second ranks are classified based on a color coordinates distribution of the first and second light emitting diode chips.

4. The light emitting apparatus of claim 1, wherein the first light emitting diode chip has a peak wavelength difference of less than 2 nm from a peak wavelength of the third light emitting diode chip or the fourth light emitting diode chip.

5. The light emitting apparatus of claim 1, wherein the first and second light emitting devices are alternately arranged on a board such that the light emitted by the first light emitting device mixes with light emitted by the second light emitting device to form the light of the third rank, and wherein the first and second ranks are ranks deviating from the third rank.

6. The light emitting apparatus of claim 3, wherein the first rank and the second rank exist in a complementary color relationship or opposite region around the third rank in a color chromaticity diagram.

7. The light emitting apparatus of claim 1, wherein the first and second ranks are chromaticity ranks and the third rank corresponds to a white chromaticity rank, and wherein, in the first and second chromaticity ranks, a range of a chromaticity $\Delta E$ is $0 < \Delta E \leq 5$ in a Commission International de l'Eclairage (CIE) Lab space, and the $\Delta E$ represents a distance between two points in the Lab space.

8. The light emitting apparatus of claim 1, wherein the first to fourth light emitting diode chips includes a compound semiconductor of group III-V element.

9. The light emitting apparatus of claim 1, wherein the resin materials of the first and second light emitting devices are formed of a transparent material.

10. A display apparatus, comprising:

a light emitting apparatus including:

a first light emitting device having first and second light emitting diode chips configured to emit light of a first rank included in a first color gamut, and a second light emitting device having third and fourth light emitting diode chips configured to emit light of a second rank included in the blue color gamut, said first rank being different than the second rank, wherein the first and second light emitting devices are arranged on a board with respect to each other such that the light emitted by the first light emitting device mixes with light emitted by the second light emitting device to form light of a third rank different than the first and second ranks;

a display panel configured to display information; and an optical member disposed between the display panel and the light emitting apparatus and configured to guide the light having the third rank emitted by the light emitting apparatus be incident to a back surface of the display panel, wherein the first rank and the second rank are distributed in the blue color gamut, and have different peak wavelength from each other, wherein the first and second light emitting devices have a different peak wavelength classified in the blue color gamut, wherein the first and second light emitting diode chips have a difference peak wavelength from each other in the blue color gamut, wherein the third and fourth light emitting diode chips have a difference peak wavelength from each other in the blue color gamut, wherein the first light emitting device is a first body having a first cavity and a resin material having a fluorescent substance covering the first and second light emitting diode chips disposed in the first cavity, wherein the second light emitting device includes a second body having a second cavity and a resin material having a fluorescent substance covering the third and fourth light emitting diode chips in the second cavity, and wherein the first body is spaced apart from the second body.

11. The display apparatus of claim 10, wherein the light emitting apparatus further includes a third light emitting device including a third light emitting diode chip configured to also emit light of a fourth rank included in the blue color gamut, wherein the first, second and third light emitting devices are arranged on the board with respect to each other such that the light emitted by the first, second and third light emitting devices mix to form the light of the third rank, and wherein the first rank and the fourth rank have a different peak wavelength in the blue color gamut.

12. The display apparatus of claim 10, wherein the first and third light emitting diode chips have a different peak wavelength in a range of 450 nm-455 nm.

13. A light emitting apparatus, comprising:
a first light emitting device including first and second light emitting diode chips configured to emit light of a first rank; and
a second light emitting device including third and fourth light emitting diode chips configured to emit light of a second rank, said first rank being different than the second rank,
wherein the first and second light emitting devices are arranged in relation to each other such that the light emitted by the first light emitting device mixes with light emitted by the second light emitting device to form light of a third rank different than the first and second ranks,
wherein the first and second light emitting devices have a different peak wavelength from each other,
wherein the first to fourth light emitting diode chips are one of a red LED chip, a green LED chip, a blue LED chip and a UV LED chip,
wherein the first and second light emitting diode chips have a difference peak wavelength from each other,
wherein the third and fourth light emitting diode chips have a difference peak wavelength from each other,
wherein the first light emitting device is a first body having a first cavity and a resin material on the first and second light emitting device chips disposed in the first cavity,
wherein the second light emitting device includes a second body having a second cavity and a resin material on the third and fourth light emitting device chips disposed in the second cavity,
wherein the first body is spaced apart from the second body,
wherein the first light emitting diode chip has a peak wavelength difference of less than 2 nm from a peak wavelength of the third light emitting diode chip or the fourth light emitting diode chip, and
wherein the first and third light emitting chips have a different peak wavelength from each other in a range less than 455 nm.

14. The light emitting apparatus of claim 13, wherein the resin material of the first and second light emitting devices includes a fluorescent substance.

15. The light emitting apparatus of claim 13, wherein the first and second light emitting devices emits a white light.

16. The light emitting apparatus of claim 13, wherein the first to fourth light emitting diode chips are a blue LED chip.

17. The light emitting apparatus of claim 13, wherein the first to fourth light emitting diode chips are a UV LED chip.

* * * * *